(12) United States Patent
Xia et al.

(10) Patent No.: US 6,258,735 B1
(45) Date of Patent: Jul. 10, 2001

(54) METHOD FOR USING BYPASS LINES TO STABILIZE GAS FLOW AND MAINTAIN PLASMA INSIDE A DEPOSITION CHAMBER

(75) Inventors: Li-qun Xia; Tian-hoe Lim, both of Santa Clara; Huong Thanh Nguyen, San Ramon; Dian Sugiarto, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/680,562

(22) Filed: Oct. 5, 2000

(51) Int. Cl.[7] .......................... H01L 21/31; H01L 21/469
(52) U.S. Cl. .......................... 438/788; 438/787; 438/789; 427/99; 427/515; 427/578
(58) Field of Search .................................. 438/787, 788, 438/789; 427/255.6, 99, 515, 578

(56) References Cited

U.S. PATENT DOCUMENTS

| | | | |
|---|---|---|---|
| 5,298,587 | 3/1994 | Hu et al. | 528/10 |
| 5,853,804 * | 12/1998 | Hansen | 427/248.1 |
| 5,862,057 | 1/1999 | Xia et al. | 364/488 |
| 5,963,840 | 10/1999 | Xia et al. | 438/783 |
| 5,994,209 | 11/1999 | Yieh et al. | 438/541 |
| 6,025,222 * | 2/2000 | Kimura et al. | 438/240 |
| 6,068,884 | 5/2000 | Rose et al. | 427/255.6 |
| 6,077,562 * | 6/2000 | Dornfest et al. | 427/255.28 |
| 6,147,009 | 11/2000 | Grill et al. | 438/780 |
| 6,159,871 | 12/2000 | Loboada et al. | 438/786 |

FOREIGN PATENT DOCUMENTS

| | | | | |
|---|---|---|---|---|
| 196 54 737 A1 | 3/1997 | (DE) | | H01L/21/31 |
| 0 960 958 A2 | 12/1999 | (EP) | | C23C/16/30 |

* cited by examiner

Primary Examiner—John F. Niebling
Assistant Examiner—Alexander G. Ghyka
(74) Attorney, Agent, or Firm—Thomason, Moser & Patterson

(57) ABSTRACT

The present invention provides a method of depositing a carbon doped silicon oxide film having a low dielectric constant (k). The concentration of oxygen is controlled to produce soft plasma conditions inside the chamber while a precursor gas is diverted through a bypass to stabilize the precursor gas flow prior to routing the precursor into the chamber and using a back to back plasma deposition scheme.

23 Claims, 3 Drawing Sheets

PROCESS FLOW CHART

METHOD FOR USING BYPASS LINES TO STABILIZE GAS FLOW AND MAINTAIN PLASMA INSIDE A DEPOSITION CHAMBER

BACKGROUND OF THE INVENTION

1. Field of the Invention

The present invention relates to the fabrication of integrated circuits. More particularly, the invention relates to a process for depositing a carbon doped silicon oxide layer on a substrate.

2. Background of the Related Art

One of the primary steps in the fabrication of modern semiconductor devices is the formation of metal and dielectric films on a substrate by chemical reaction of gases. Such deposition processes are referred to as chemical vapor deposition or CVD. Conventional thermal CVD processes supply reactive gases to the substrate surface where heat-induced chemical reactions take place to produce a desired film. The high temperatures at which some thermal CVD processes operate can damage device structures having layers previously formed on the substrate. Plasma-enhanced CVD techniques promote excitation and/or disassociation of the reactant gases by the application of radio frequency (RF) energy to a reaction zone, thereby creating a plasma of highly reactive species.

Semiconductor device geometries have dramatically decreased in size since such devices were first introduced several decades ago. Since then, integrated circuits have generally followed the two year/half-size rule (often called Moore's Law), which means that the number of devices that will fit on a chip doubles every two years. Today's fabrication plants are routinely producing devices having 0.35 $\mu$m and even 0.18 $\mu$m feature sizes, and tomorrow's plants soon will be producing devices having even smaller geometries.

In order to further reduce the size of devices on integrated circuits, it has become necessary to use conductive materials having low resistivity and insulators having a low k (dielectric constant <4.0) to reduce the capacitive coupling between adjacent metal lines. An example of films having dielectric constants of about 3.0 or less are films deposited from organosilicon compounds, such as organo silanes and organo siloxanes, at conditions sufficient to deposit silicon oxide films containing from about 1% to about 50% carbon by atomic weight.

However, typical deposition processes may result in wafer damage reducing yield and increasing production costs. One such deposition technique simultaneously introduces an oxidizer and an organosilicon compound into a deposition chamber prior to striking plasma. The ignition of the oxidizer and organosilicon mixture causes a pressure spike due to the disassociation of the organosilicon compound into fragments that increases gas density. The initial increase in ionization induces charge on the wafer and can cause wafer damage. Additionally, wafer damage caused by arcing can occur when electro current strikes through the deposited films due to a high current causing excessive heating and resulting in spotting, i.e., a circular, ring like burn mark, on the wafer surface.

Another typical deposition technique involves igniting a first plasma in a first environment to deposit an oxide layer, terminating the first plasma, then igniting a second plasma in a second environment to deposit a carbon doped silicon oxide layer on a substrate. The termination step between the two plasma steps, i.e., stopping and starting plasma at different process conditions, induces charge on the wafer by allowing the build up of ionic contaminants and particulates causing wafer damage. One approach to prevent wafer damage caused by arcing and spotting is to deposit a thicker thermal oxide layer, however, the increased thickness results in a higher k film.

One indicator of wafer damage caused by, for example, ionic contaminants, arcing, spotting and tunneling, i.e., ionic striking, or induced current, across the wafer due to an uneven charge distribution which can result in shorting, is the plasma damage measurement (PDM). The PDM is typically calculated by measuring the voltage across the surface of the wafer at a number of points and then subtracting the minimum from the maximum. Generally, the larger the voltage difference across the wafer the greater the wafer damage.

Therefore, process conditions for depositing carbon doped silicon oxide films are desired.

SUMMARY OF THE INVENTION

The present invention generally relates to a process of depositing a carbon doped silicon oxide film having a low dielectric constant (k) on a substrate. In one aspect, the concentration of oxygen is controlled to produce soft plasma conditions inside the chamber while a precursor gas is diverted through a bypass line to stabilize precursor gas flow prior to routing the precursor gas into the chamber.

In another aspect, a method is provided in which a substrate is positioned in a processing chamber and an oxidizer is introduced into the processing region and a plasma is ignited. A carbon silicon gas source is flowed through a bypass line to stabilize the gas flow. Then, the precursor gas is introduced into the chamber and a back to back plasma is maintained to deposit a carbon doped silicon oxide film on the substrate.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Aspects of the invention are described in reference to a method for depositing a silicon oxide layer having a low dielectric constant. The silicon oxide layer(s) are produced from organosilicon compounds containing carbon in organo groups that are not readily removed by oxidation at processing conditions. Suitable organo groups include alkyl, alkenyl, cyclohexenyl, and aryl groups and functional derivatives. The organosilicon compounds include:

methylsilane, $CH_3$—$SiH_3$
dimethylsilane, $(CH_3)_2$—$SiH_2$
trimethylsilane, $(CH_3)_3$—$SiH$
tetramethylsilane, $(CH_3)_4$—$Si$
dimethylsilanediol, $(CH_3)_2$—$Si$—$(OH)_2$
ethylsilane, $CH_3$—$CH_2$—$SiH_3$
phenylsilane, $C_6H_5$—$SiH_3$
diphenylsilane, $(C_6H_5)_2$—$SiH_2$
diphenylsilanediol, $(C_6H_5)_2$—$Si$—$(OH)_2$
methylphenylsilane, $C_6H_5$—$SiH_2$—$CH_3$
disilanomethane, $SiH_3$—$CH_2$—$SiH_3$
bis(methylsilano)methane, $CH_3$—$SiH_2$—$CH_2$—$SiH_2$—$CH_3$
1,2-disilanoethane, $SiH_3$—$CH_2$—$CH_2$—$SiH_3$
1,2-bis(methylsilano)ethane, $CH_3$—$SiH_2$—$CH_2$—$CH_2$—$SiH_2$—$CH_3$
2,2-disilanopropane, $SiH_3$—$C(CH_3)_2$—$SiH_3$
1,3,5-trisilano-2,4,6-trimethylene, —($—SiH_2CH_2—$)$_3$ -(cyclic)
dimethyldimethoxysilane, $(CH_3)_2$—$Si$—$(OCH_3)_2$
diethyldiethoxysilane, $(CH_3CH_2)_2$—$Si$—$(OCH_2CH_3)_2$
dimethyldiethoxysilane, $(CH_3)_2$—$Si$—$(OCH_2CH_3)_2$
diethyldimethoxysilane, $(CH_3CH_2)_2$—$Si$—$(OCH_3)_2$
1,3-dimethyldisiloxane, $CH_3$—$SiH_2$—$O$—$SiH_2$—$CH_3$
1,1,3,3-tetramethyldisiloxane, $(CH_3)_2$—$SiH$—$O$—$SiH$—$(CH_3)_2$
hexamethyldisiloxane, $(CH_3)_3$—$Si$—$O$—$Si$—$(CH_3)_3$
1,3-bis(silanomethylene)disiloxane, $(SiH_3$—$CH_2$—$SiH_2$—$)_2$—$O$
bis(1-methyldisiloxanyl)methane, $(CH_3$—$SiH_2$—$O$—$SiH_2$—$)_2$—$CH_2$
2,2-bis(1-methyldisiloxanyl)propane, $(CH_3$—$SiH_2$—$O$—$SiH_2$—$)_2$—$C(CH_3)_2$
2,4,6,8-tetramethylcyclotetrasiloxane, —($—SiHCH_3$—$O$—$)_4$-(cyclic)
octamethylcyclotetrasiloxane, —($—Si(CH_3)_2$—$O$—$)_4$-(cyclic)
2,4,6,8,10-pentamethylcyclopentasiloxane, —($—SiHCH_3$—$O$—$)_5$-(cyclic)
1,3,5,7-tetrasilano-2,6-dioxy-4,8-dimethylene, —($—SiH_2$—$CH_2$—$SiH_2$—$O$—$)_2$-(cyclic)
2,4,6-trisilanetetrahydropyran, —$SiH_2$—$CH_2$—$SiH_2$—$CH_2$—$SiH_2$—$O$-(cyclic)
2,5-disilanetetrahydrofuran, —$SiH_2$—$CH_2$—$CH_2$—$SiH_2$—$O$-(cyclic),
and fluorinated derivatives thereof.

The organosilicon compounds are oxidized during deposition, preferably by reaction with oxygen ($O_2$) or oxygen containing compounds such as nitrous oxide ($N_2O$), carbon monoxide (CO), carbon dioxide ($CO_2$), and water ($H_2O$), preferably $O_2$ and $N_2O$. Organosilicon compounds that contain oxygen may be decomposed to provide the oxygen. Preferably, the carbon to silicon ratio in the film is between about 1:9 and about 1:1. The deposited films formed from oxidized organosilicon compounds have dielectric constants of less than about 3.0 and low moisture content.

Figure 1:
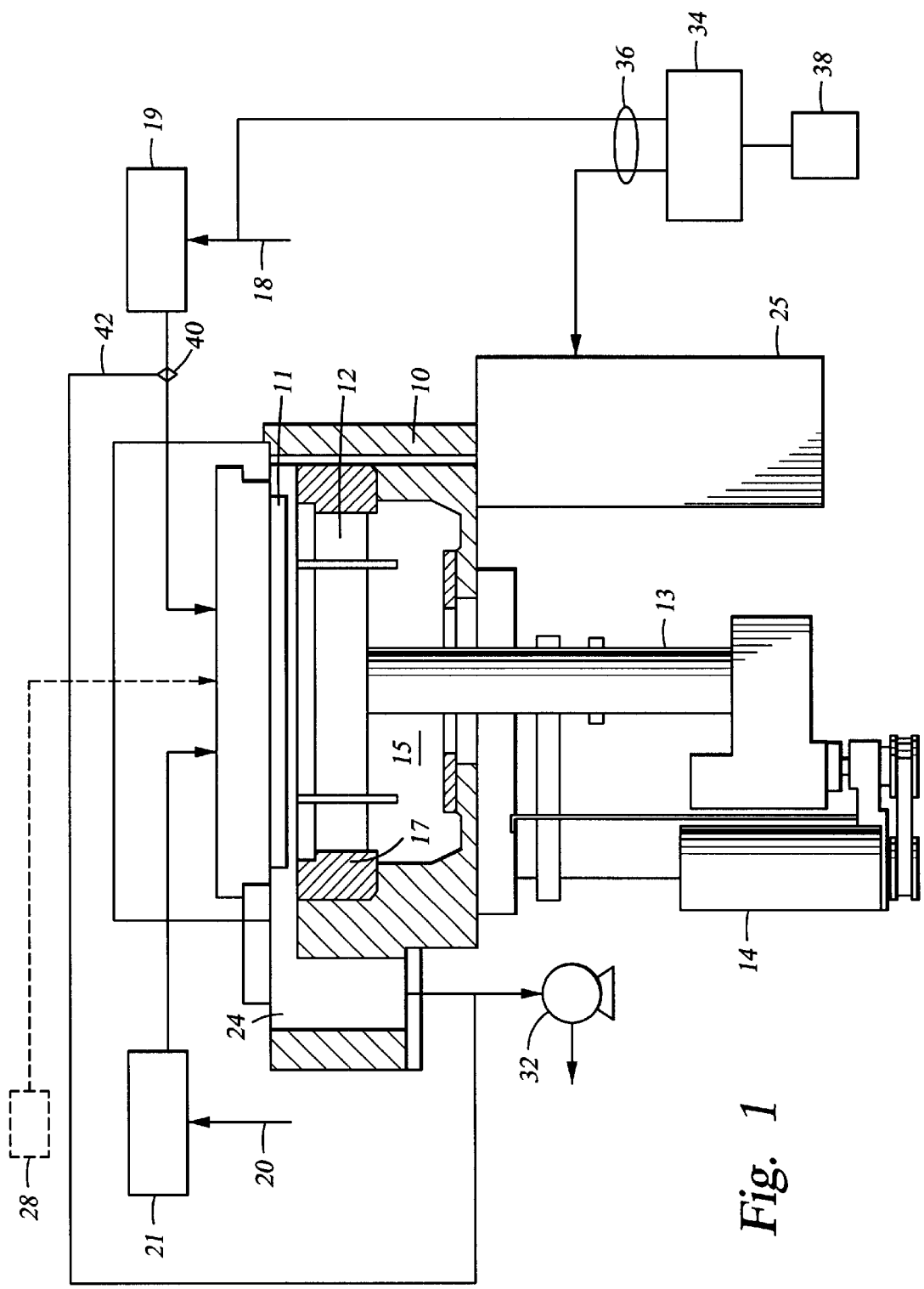
FIG. 1 is a cross-sectional diagram of an exemplary CVD plasma reactor configured for use according to the present invention.

FIG. 1 shows a vertical, cross-section view of a parallel plate chemical vapor deposition reactor 10 having a high vacuum region 15. The reactor 10 contains a gas distribution manifold 11 for dispersing process gases through perforated holes in the manifold to a substrate or wafer (not shown) that rests on a substrate support plate or susceptor 12 which is raised or lowered by a lift motor 14.

The reactor 10 includes heating of the process gases and substrate, such as by resistive heating coils (not shown) or external lamps (not shown). Susceptor 12 is mounted on a support stem 13 so that susceptor 12 (and the wafer supported on the upper surface of susceptor 12) can be controllably moved between a lower loading/off-loading position and an upper processing position adjacent to the manifold 11.

When susceptor 12 and the wafer are in the processing position, they are surrounded by a an insulator 17 and process gases exhaust into a manifold 24. During processing, gases inlet to manifold 11 are uniformly distributed radially across the surface of the wafer. A vacuum pump 32 having a throttle valve controls the exhaust rate of gases from the chamber.

Before reaching manifold 11, deposition and carrier gases are input through gas lines 18, 20 into a mixing systems 19, 21 where they are combined and then sent to manifold 11. Generally, the supply lines 18, 20 for each of the process gases also includes (i) safety shut-off valves (not shown) that can be used to automatically or manually shut off the flow of process gas into the chamber, and (ii) mass flow controllers (also not shown) that measure the flow of gas through the gas supply lines. When toxic gases are used in the process, several safety shut-off valves are positioned on each gas supply line in conventional configurations. According to an aspect of the invention, a bypass line 42 and a valve member 40 are connected the gas line 18 to allow a carbon silicon gas source, such as trimehylsilane (TMS), from the gas source to be diverted to the exhaust system, thus circumventing the vacuum chamber 10, allowing the carbon silicon gas source to stabilize prior to routing the carbon silicon gas to the chamber 10.

The deposition process performed in reactor 10 can be either a thermal process or a plasma enhanced process. In a plasma enhanced process, a controlled plasma is typically formed adjacent to the wafer by RF energy applied to distribution manifold 11 from RF power supply 25 (with susceptor 12 grounded). Alternatively, RF power can be provided to the susceptor 12 or RF power can be provided to different components at different frequencies. RF power supply 25 can supply either single or mixed frequency RF power to enhance the decomposition of reactive species introduced into the high vacuum region 15. A mixed frequency RF power supply typically supplies power at a high RF frequency (RF1) of 13.56 MHz to the distribution manifold 11 and at a low RF frequency (RF2) of 360 KHz to the susceptor 12.

When additional dissociation of the oxidizing gas is desired, an optional microwave chamber 28 (shown in phantom) can be used to input from between about 0 Watts and about 6000 Watts of microwave power to the oxidizing gas prior to entering the deposition chamber. Separate delivery of microwave power would avoid excessive dissociation of the organosilicon compounds prior to reaction with the oxidizing gas. A gas distribution plate having separate passages for the organosilicon compound and the oxidizing gas is preferred when microwave power is added to the oxidizing gas.

The lift motor 14 raises and lowers susceptor 12 between a processing position and a lower, wafer-loading position. The motor, the gas mixing system 19, and the RF power supply 25 are controlled by a system controller 34 over control lines 36. The reactor includes analog assemblies, such as mass flow controllers (MFCs) and standard or pulsed RF generators, that are controlled by the system controller 34 which executes system control software stored in a memory 38, which in the preferred embodiment is a hard disk drive. Motors and optical sensors are used to move and determine the position of movable mechanical assemblies such as the throttle valve of the vacuum pump 32 and motor for positioning the susceptor 12.

The system controller 34 controls all of the activities of the CVD reactor and a preferred embodiment of the controller 34 includes a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard which defines board, card cage, and connector dimensions and types. The VME standard also defines the bus structure having a 16-bit data but and 24-bit address bus.

The system controller 34 operates under the control of a computer program stored on the hard disk drive 38. The computer program dictates the timing, mixture of gases, RF power levels, susceptor position, and other parameters of a particular process.

Figure 2:
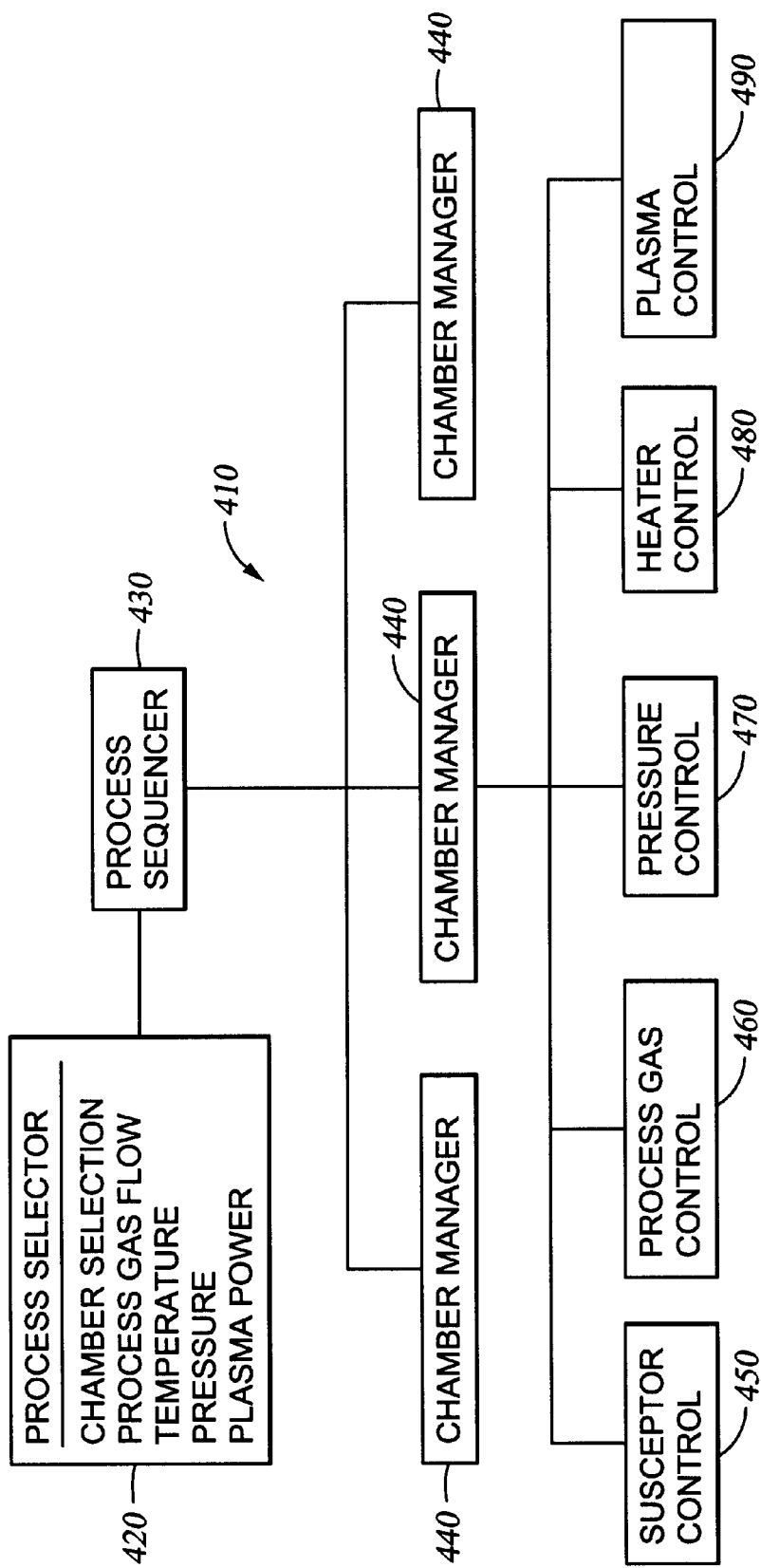
FIG. 2 is a flow chart of a process control computer program product used in conjunction with the exemplary plasma reactor of FIG. 1.

Referring to FIG. 2, processes can be implemented using a computer program product 410 that runs on, for example, the system controller 34. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

FIG. 2 shows an illustrative block diagram of the hierarchical control structure of the computer program 410. A user enters a process set number and process chamber number into a process selector subroutine 420 in response to menus or screens displayed on the CRT monitor 40 by using the light pen 44 interface. The process sets are predetermined sets of process parameters necessary to carry out specified processes, and are identified by predefined set numbers. The process selector subroutine 420 the (i) selects a desired process chamber on a cluster tool such as an Centura® platform (available from Applied Materials, Inc.), and (ii) selects a desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe. The parameters specified by the recipe are entered utilizing the light pen/CRT monitor interface.

The signals for monitoring the process are provided by the analog input and digital input boards of system controller and the signals for controlling the process are output on the analog output and digital output boards of the system controller 34.

A process sequencer subroutine 430 comprises program code for accepting the identified process chamber and set of process parameters from the process selector subroutine 420, and for controlling operation of the various process chambers. Multiple users can enter process set numbers and process chamber numbers, or a user can enter multiple process chamber numbers, so the sequencer subroutine 430 operates to schedule the selected processes in the desired sequence. Preferably the sequencer subroutine 430 includes computer readable program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 430 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 430 determines which process chamber and process set combination is going to be executed next, the sequencer subroutine 430 causes execution of the process set by passing the particular process set parameters to a chamber manager subroutine 440 which controls multiple processing tasks in a process chamber 10 according to the process set determined by the sequencer subroutine 430. For example, the chamber manager subroutine 440 comprises program code for controlling CVD process operations in the process chamber 10. The chamber manager subroutine 440 also controls execution of various chamber component subroutines which control operation of the chamber component necessary to carry out the selected process set. Examples of chamber component subroutines are susceptor control subroutine 450, process gas control subroutine 460, pressure control subroutine 470, heater control subroutine 480, and plasma control subroutine 490. Those having ordinary skill in the art would readily recognize that other chamber control subroutines can be included depending on what processes are desired to be performed in the reactor 10.

In operation, the chamber manager subroutine 440 selectively schedules or calls the process component subroutines in accordance with the particular process set being executed. The chamber manager subroutine 440 schedules the process component subroutines similarly to how the sequencer subroutine 430 schedules which process chamber 10 and process set is to be executed next. Typically, the chamber manager subroutine 440 includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 2. The susceptor control positioning subroutine 450 comprises program code for controlling chamber components that are used to load the substrate onto the susceptor 12, and optionally to lift the substrate to a desired height in the reactor 10 to control the spacing between the substrate and the gas distribution manifold 11. When a substrate is loaded into the reactor 10, the susceptor 12 is lowered to receive the substrate, and thereafter, the susceptor 12 is raised to the desired height in the chamber, to maintain the substrate at a first distance or spacing from the gas distribution manifold 11 during the CVD process. In operation, the susceptor control subroutine 450 controls movement of the susceptor 12 in response to process set parameters that are transferred from the chamber manager subroutine 440.

The process gas control subroutine 460 has program code for controlling process gas composition and flow rates. The process gas control subroutine 460 controls the open/close position of the safety shut-off valves, and also ramps up/down the mass flow controllers to obtain the desired gas flow rate. The process gas control subroutine 460 is invoked by the chamber manager subroutine 440, as are all chamber components subroutines, and receives from the chamber manager subroutine process parameters related to the desired gas flow rates. Typically, the process gas control subroutine 460 operates by opening the gas supply lines, and repeatedly (i) reading the necessary mass flow controllers, (ii) comparing the readings to the desired flow rates received from the chamber manager subroutine 440, and (iii) adjusting the flow rates of the gas supply lines as necessary. Furthermore, the process gas control subroutine 460 includes steps for monitoring the gas flow rates for unsafe rates, and activating the safety shut-off valves when an unsafe condition is detected.

The pressure control subroutine 470 comprises program code for controlling the pressure in the reactor 10 by regulating the size of the opening of the throttle valve in the exhaust pump 32. The size of the opening of the throttle valve is set to control the chamber pressure to the desired level in relation to the total process gas flow, size of the process chamber, and pumping set point pressure for the exhaust pump 32. When the pressure control subroutine 470 is invoked, the desired, or target pressure level is received as a parameter from the chamber manager subroutine 440. The pressure control subroutine 470 operates to measure the pressure in the reactor 10 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 470 can be written to open or close the throttle valve to a particular opening size to regulate the reactor 10 to the desired pressure.

The heater control subroutine 480 comprises program code for controlling the temperature of the heat modules or radiated heat that is used to heat the susceptor 12. The heater control subroutine 480 is also invoked by the chamber manager subroutine 440 and receives a target, or set point, temperature parameter. The heater control subroutine 480 measures the temperature by measuring voltage output of a thermocouple located in a susceptor 12, compares the measured temperature to the set point temperature, and increases or decreases current applied to the heat module to obtain the set point temperature. The temperature is obtained from the measured voltage by looking up the corresponding temperature in a stored conversion table, or by calculating the temperature using a fourth order polynomial. The heater control subroutine 480 gradually controls a ramp up/down of current applied to the heat module. The gradual ramp up/down increases the life and reliability of the heat module. Additionally, a built-in-fail-safe mode can be included to detect process safety compliance, and can shut down operation of the heat module if the reactor 10 is not properly set up.

The plasma control subroutine 490 comprises program code for setting the RF bias voltage power level applied to the process electrodes in the reactor 10, and optionally, to set the level of the magnetic field generated in the reactor. Similar to the previously described chamber component subroutines, the plasma control subroutine 490 is invoked by the chamber manager subroutine 440.

The above CVD system description is mainly for illustrative purposes, and other plasma CVD equipment such as electrode cyclotron resonance (ECR) plasma CVD devices, induction-coupled RF high density plasma CVD devices, or the like may be employed. Additionally, variations of the above described system such as variations in susceptor design, heater design, location of RF power connections and others are possible. For example, the wafer could be supported and heated by a resistively heated susceptor. The pretreatment and method for forming a pretreated layer of the present invention is not limited to any specific apparatus or to any specific plasma excitation method.

Figure 3:
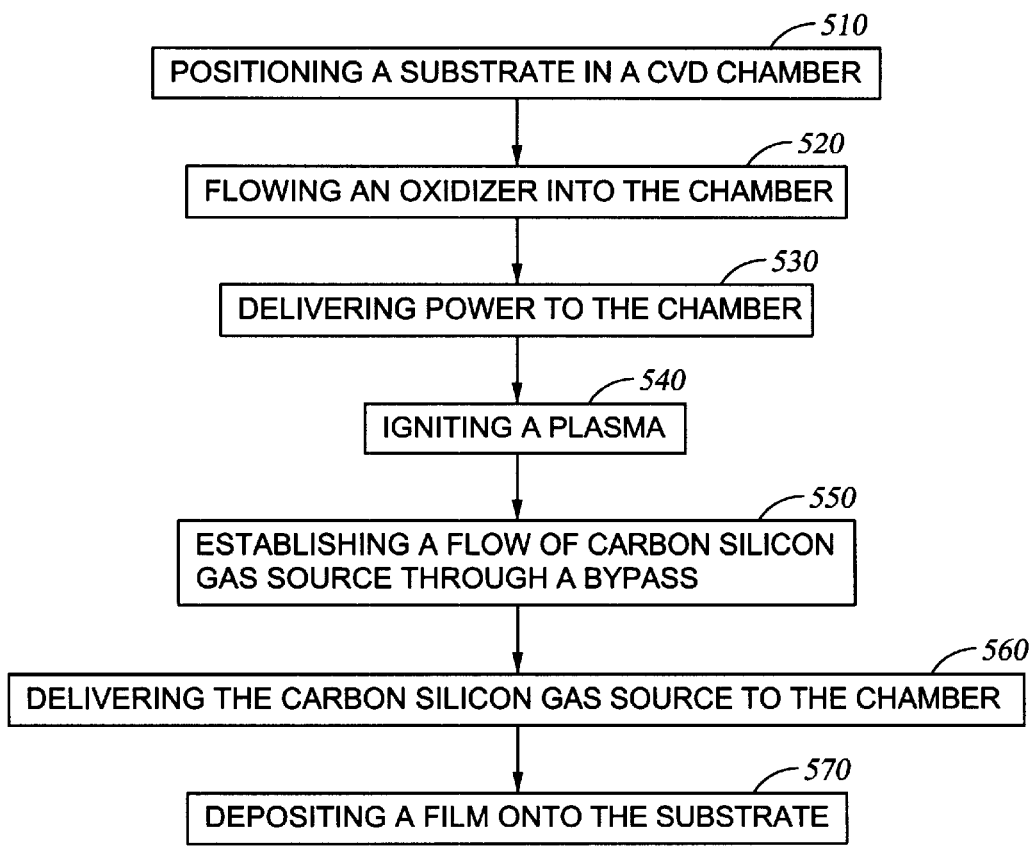
FIG. 3 is a flowchart showing the processing steps of the present invention.

FIG. 3 is a flowchart representing a method for depositing a carbon doped silicon oxide film having a low dielectric constant (k) on a substrate. The back to back plasma scheme, i.e., $O_2$ plasma followed directly by deposition without an intermediate termination step, with TMS stabilization through a bypass creates a thin oxide low k interface. Generally in step 510, a substrate is positioned in a chamber, such as the CVD chamber 10 shown in FIG. 1, on a substrate support pedestal 12. The spacing between the substrate and the showerhead 11 is between about 100 mils and about 400 mils, preferably about 250 mils. Then in step 520 an oxidizer, such as oxygen, is introduced into the chamber at a first flow rate from about 150 sccm to about 350 sccm, preferably about 200 sccm. The pressure within the processing chamber 10 is regulated between about 2 Torr and about 6 Torr, preferably about 4 Torr, by vacuum source 32, such as a vacuum pump. Additionally, a heater is provided and the chamber temperature is maintained from about 300° C. to about 400° C., preferably about 350° C.

In step 530, an RF power supply 25 delivers power to the chamber at a first level from about 100 W to about 300 W, preferably about 200 W. Then in step 540, a soft oxygen plasma is ignited in the process chamber 10, from about 15 seconds to about 25 seconds, preferably about 20 seconds. As used herein, a soft plasma is defined as a plasma ignited at a low power level and a low gas flow rate. The soft oxygen plasma has an advantage of pre-treating the wafer surface by heating and reducing contaminants thereon. Next in step 550, a gas flow of a carbon silicon gas source, such as TMS, is established through a bypass 42 at a rate from about 500 sccm to about 700 sccm, preferably about 600 sccm, and exhausted to an exhaust system while stabilizing the gas flow from about 8 seconds to about 12 seconds, preferably 10 seconds. The oxidizer flow rate is then reduced to about 50 sccm to about 150 sccm, preferably about 100 sccm, and the power is increased to a level from about 500 W to about 700 W, preferably about 600 W.

Next in step 560, the carbon silicon gas source is delivered through a valve member 40 to the chamber 10 and mixes with the soft oxygen plasma maintained from step 540 to form a second plasma. The continuation of the first plasma to the second plasma without extinguishing the first plasma is referred to as back to back plasma. The pressure in the chamber 10 is regulated through the throttle valve in the exhaust pump 32 and can be computer controlled through the pressure control subroutine 470. Finally in step 570 a carbon doped silicon oxide film is deposited onto the substrate, preferably having a dielectric constant less than about 3. While the back to back plasma scheme with a bypass is preferred for one aspect of the deposition process, back to back plasma with out a bypass is contemplated for other deposition processes.

Generally, a large voltage gradient across the surface of a substrate indicates a likelihood for tunneling and shorting. Substrates processed according to one aspect of the invention showed greater charge uniformity across the surface of the wafer, thus, a reduction in shorting and tunneling.

Additionally, substrates processed according to one aspect of the invention demonstrated minimized wafer damage caused by outgassing. Outgassing occurs when ionic contaminants and particulates trapped within the deposited layers travel to the wafer surface and result in bubbles. Problems related to outgassing may occur during the packaging process when temperatures can reach up to about 450° C. A Nitride Popping Test was preformed on substrates processed according to one aspect of the invention. The substrates were visually inspected for damage caused by outgassing after a 2,000 Å silicon nitride (SiN) passivation layer, i.e., a sealing layer added at the end of the fabrication process to prevent deterioration and protect against moisture and contamination, was deposited over the carbon doped silicon oxide layer and furnace annealed at 450° C. for one hour. The substrates processed according to one aspect of the invention passed the Nitride Popping Test, while substrates that were processed conventionally failed.

While the foregoing is directed to the preferred embodiment of the present invention, other and further embodiments of the invention may be devised without departing from the basic scope thereof, and the scope thereof is determined by the claims that follow.

What is claimed is:

1. A method for depositing a film on a substrate, comprising:
    positioning a substrate in a chamber;
    flowing oxygen into the chamber;
    generating an oxygen plasma;
    establishing a flow of a carbon silicon gas source through a bypass;
    delivering the carbon silicon gas source to the chamber; and
    depositing a film on the substrate.

2. The method of claim 1, wherein the oxygen is introduced into the chamber at a first flow rate of about 150 sccm to about 250 sccm and adjusted to a second flow rate of about 250 sccm to about 350 sccm.

3. The method of claim 1, wherein the carbon silicon gas source is trimethysilane.

4. The method of claim 3, wherein the trimethysilane is introduced into the chamber at a flow rate of about 500 sccm to about 700 sccm.

5. The method of claim 1, wherein the chamber is maintained at a temperature of about 300° C. to about 400° C.

6. The method of claim 1, wherein a chamber pressure is maintained from about 2 Torr to about 6 Torr.

7. The method of claim 1, further comprising:
    supplying an RF power source to the chamber at a first rate of about 100 W to about 300 W, and a second rate of about 500 W to about 700 W.

8. The method of claim 1, wherein a space between the substrate and a shower head is maintained from about 100 mils to about 400 mils.

9. The method of claim 1, wherein the film deposited on the substrate has a dielectric constant of less than about 3.

10. A method for depositing a film on a substrate, comprising:
    flowing an oxidizer at a first flow rate into a chemical vapor deposition chamber;
    delivering power to the chamber;
    igniting a plasma;
    flowing a precursor gas through a bypass;
    introducing the precursor gas flow to the chamber; and
    depositing a film on the substrate.

11. The method of claim 10, further comprising:
    flowing the precursor gas to an exhaust system while stabilizing a precursor gas flow.

12. The method of claim 11, further comprising:
    reducing the first flow rate of the oxidizer to a second flow rate.

13. The method of claim 12, wherein the power is delivered from an RF power source and is increased while depositing the film.

14. The method of claim 10, wherein the oxidizer gas is oxygen.

15. The method of claim 14, wherein the first flow rate is about 150 sccm to about 250 sccm and the second flow rate is about 250 sccm to about 350 sccm.

16. The method of claim 10, wherein the precursor gas is an organosilicon compound.

17. The method of claim 16, wherein the organosilicon compound is trimethylsilane.

18. The method of claim 17, wherein the trimethylsilane is supplied at a flow rate of about 500 sccm to about 700 sccm.

19. The method of claim 18, wherein the chamber is maintained at a temperature of about 300° C. to about 400° C.

20. The method of claim 10, wherein the RF power to the chamber is supplied at a first rate of about 100 W to about 300 W, and a second rate of about 500 W to about 700 W.

21. The method of claim 10, wherein a chamber pressure is maintained from about 2 Torr to about 6 Torr.

22. The method of claim 10, wherein a space between the substrate and a shower head is maintained from about 100 mils to about 400 mils.

23. The method of claim 10, wherein the film deposited on the substrate has a dielectric constant of less than about 3.

* * * * *

UNITED STATES PATENT AND TRADEMARK OFFICE
CERTIFICATE OF CORRECTION

PATENT NO. : 6,258,735 B1
DATED : July 10, 2001
INVENTOR(S) : Xia et al.

It is certified that error appears in the above-identified patent and that said Letters Patent is hereby corrected as shown below:

Title page,
Item [56], References Cited, under FOREIGN PATENT DOCUMENTS, please correct the first line to read: -- 196 54 737A1  3/1997 (DE)……………...H01L/21/31 --

Column 2,
Line 54, please replace "plasma" with -- CVD plasma --.

Signed and Sealed this

Ninth Day of July, 2002

Attest:

Attesting Officer

JAMES E. ROGAN
Director of the United States Patent and Trademark Office